(12) United States Patent
Nguyen et al.

(10) Patent No.: US 8,266,553 B1
(45) Date of Patent: Sep. 11, 2012

(54) SYSTEM AND METHOD FOR DETECTING MASK DATA HANDLING ERRORS

(75) Inventors: Bang-Thu Nguyen, Santa Clara, CA (US); Yan Wang, San Jose, CA (US); Hong-tsz Pan, Cupertino, CA (US); Xin Wu, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 1120 days.

(21) Appl. No.: 12/141,543

(22) Filed: Jun. 18, 2008

(51) Int. Cl.
*G06F 17/50* (2006.01)
(52) U.S. Cl. ........................................ 716/51
(58) Field of Classification Search .............. 716/51
See application file for complete search history.

(56) References Cited

U.S. PATENT DOCUMENTS

| | | | |
|---|---|---|---|
| 2004/0209171 A1* | 10/2004 | Ibusuki | 430/5 |
| 2006/0269851 A1 | 11/2006 | Frisa et al. | |
| 2009/0273361 A1* | 11/2009 | Batra et al. | 326/16 |

* cited by examiner

*Primary Examiner* — Suresh Memula
(74) *Attorney, Agent, or Firm* — Kenneth Glass; Thomas George; Gerald Chan

(57) ABSTRACT

An integrated circuit device layout and a method for detecting mask data handling errors are disclosed in which integrated circuit device layout includes a device region in which operable circuitry is disposed. Integrated circuit device layout also includes a verification region in which verification elements are disposed. The verification elements include cells that are duplicates of at least some of the different types of cells in device region and can include structures that are duplicates of at least some of the types of structures in the device region. The patterns in verification region are used in the final verification process to identify mask data handling errors in a mask job deck. Because the patterns in verification region are easy to locate and identify, the time required to perform the final verification process is reduced and the chance of error in the final verification process is reduced.

16 Claims, 10 Drawing Sheets

SYSTEM AND METHOD FOR DETECTING MASK DATA HANDLING ERRORS

BACKGROUND OF THE INVENTION

Once a semiconductor design is completed, the design is sent to a photomask vendor. The photomask vendor then generates a job deck that is to be used to fabricate the masks. After a verification process in which the mask manufacturer verifies that the patterns in each mask layer in the job deck accurately represent the patterns in the design, the photomask vendor sends the job deck to the customer. The customer then performs a final verification process prior to authorizing the photomask vendor to fabricate the masks. This final verification process is important to the customer since an undiscovered error could require fabrication of a whole new set of masks. This can be quite expensive since complex semiconductor mask sets often cost several million dollars.

The final verification process is typically preformed by rendering each mask layer to be verified electronically into an image file that can be viewed on a computer and generating a viewable image on the computer that is commonly referred to as a "job deck view." The engineer performing the verification process visually inspects the job deck view on a computer, moving around in the image file until a particular pattern is found. The pattern is then checked, and the engineer moves on to the next pattern to be checked. When patterns are found that should not be present, when patterns are missing or when patterns have the wrong size or shape a mask data handling error has probably occurred. The error can then be corrected prior to fabrication of photomasks.

Some parts of the final verification process, such as checking mask tone and spacing, are easily performed since the engineer can use an easily located pattern outside of the die region such as, for example, the layer ID. Checking for metal cheesing is also relatively easy since it does not require that any particular metal pattern be visually inspected.

However, checking Boolean generations, dummy metals, feature width and transistor polysilicon sizing is significantly more difficult, time consuming and prone to error since the engineer must individually verify the presence or absence of particular patterns and/or measure individual patterns in the design. Checking Boolean generation is particularly difficult. In the Boolean generation checking process the engineer must go into the die region of the design to check to make sure that all required layers and sub-layers of the design layout are included in the mask layer being verified. In particular, the engineer must move around in the die region of the image file for each mask layer to find patterns that should be present in the particular mask layer. In addition, the engineer may need to go to a location of patterns that should not be present on the particular mask layer to make sure that they are not present. This process is tedious, time consuming and error prone since it is often difficult to find the pattern to be verified among the many other similar patterns.

The time required to find each pattern to be verified increases with the complexity of the design, making it harder and harder to verify individual mask layers as more complex devices are designed. Moreover, photomask costs have significantly increased as designs have become more complex and as feature sizes have decreased, making the cost of a verification error increasingly significant.

In light of the above, a need exists for an improved method and apparatus for detecting mask data handling errors.

SUMMARY OF THE INVENTION

An integrated circuit device layout is disclosed that includes a device region in which operable circuitry is disposed and a verification region in which verification elements are disposed. The verification elements include cells that are duplicates of at least some of the different types of cells in the device region, where the cells in the verification region are not operatively coupled together. The patterns in the verification region are used in the final verification process to verify the mask job deck. This allows for easily detecting mask data handling errors.

In one aspect of the present invention a method for detecting mask data handling errors is disclosed in which an integrated circuit device layout is generated in a database, the layout including a device region and a verification region in which verification elements are disposed. The verification elements include cells that are duplicates of at least some of the different types of cells in the device region. In the present embodiment the cells in the verification region are not operatively coupled together. The method further includes verifying a mask job deck for the integrated circuit device layout using the patterns in the verification region.

In one embodiment the verification elements include structures that are duplicates of at least some of the different types of non-cell structures in the device region. In this embodiment the patterns in the verification region that correspond to the structures are also used to verify the job deck.

In one aspect of the present invention a method for verifying a job deck is disclosed for an integrated circuit design that includes a plurality of different types of transistor cells and a plurality of different types of non-transistor cells. The method includes generating an integrated circuit device layout that includes a verification region in which transistor cells that are duplicates of at least some of the different types of transistor cells are disposed and in which non-transistor cells that are duplicates of at least some of the different types of non-transistor cells are disposed. In the present embodiment, the transistor cells and the non-transistor cells in the verification region are not operatively coupled together. The method includes generating an image of a layer of the mask job deck so as to display the verification region and verifying the layer of the mask job deck using patterns in the verification region.

Because the patterns in the verification region are easy to locate and identify, the method and apparatus of the present invention reduce the time required to perform the final verification. This provides significant cost savings as compared to prior art processes in which the engineer must search through the device region of the layout to find patterns required for verification. Moreover, because the number of patterns in the verification region is limited, the engineer can more readily identify patterns, reducing the chance of error as compared to prior art processes in which the engineer must identify patterns in the device region of the layout.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
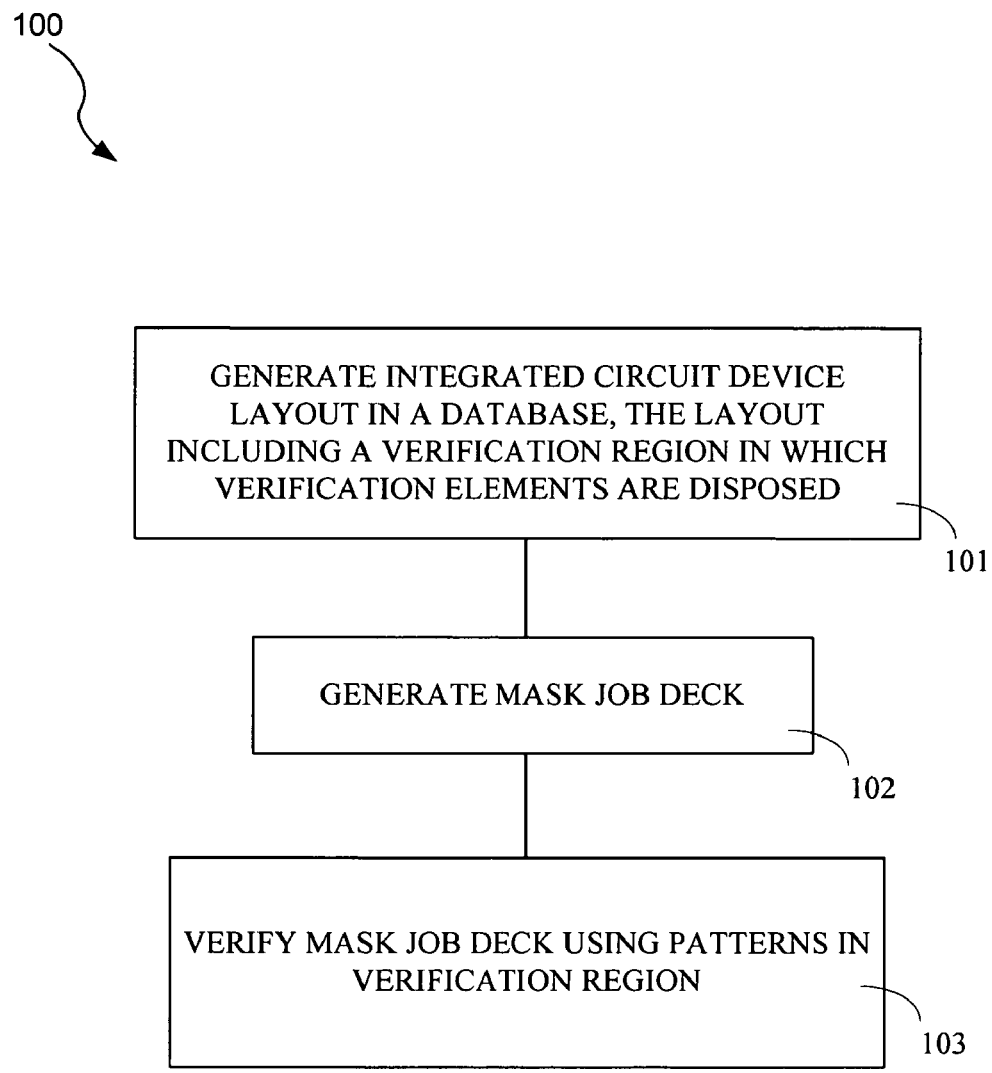
FIG. 1 is a flow chart that illustrates a method for detecting mask data handling errors in accordance with an embodiment of the present invention.

FIG. 1 illustrates a method 100 for detecting mask data handling errors in accordance with an embodiment of the present invention. As shown by step 101 an integrated circuit device layout is generated in a database, where the integrated circuit device layout includes a verification region in which verification elements are disposed. The term "verification elements" as used in the present application includes cells and structures that can be used for verification of a mask job deck. In the present embodiment, the verification region provides a summary of the significant components in the device region.

Figure 2:
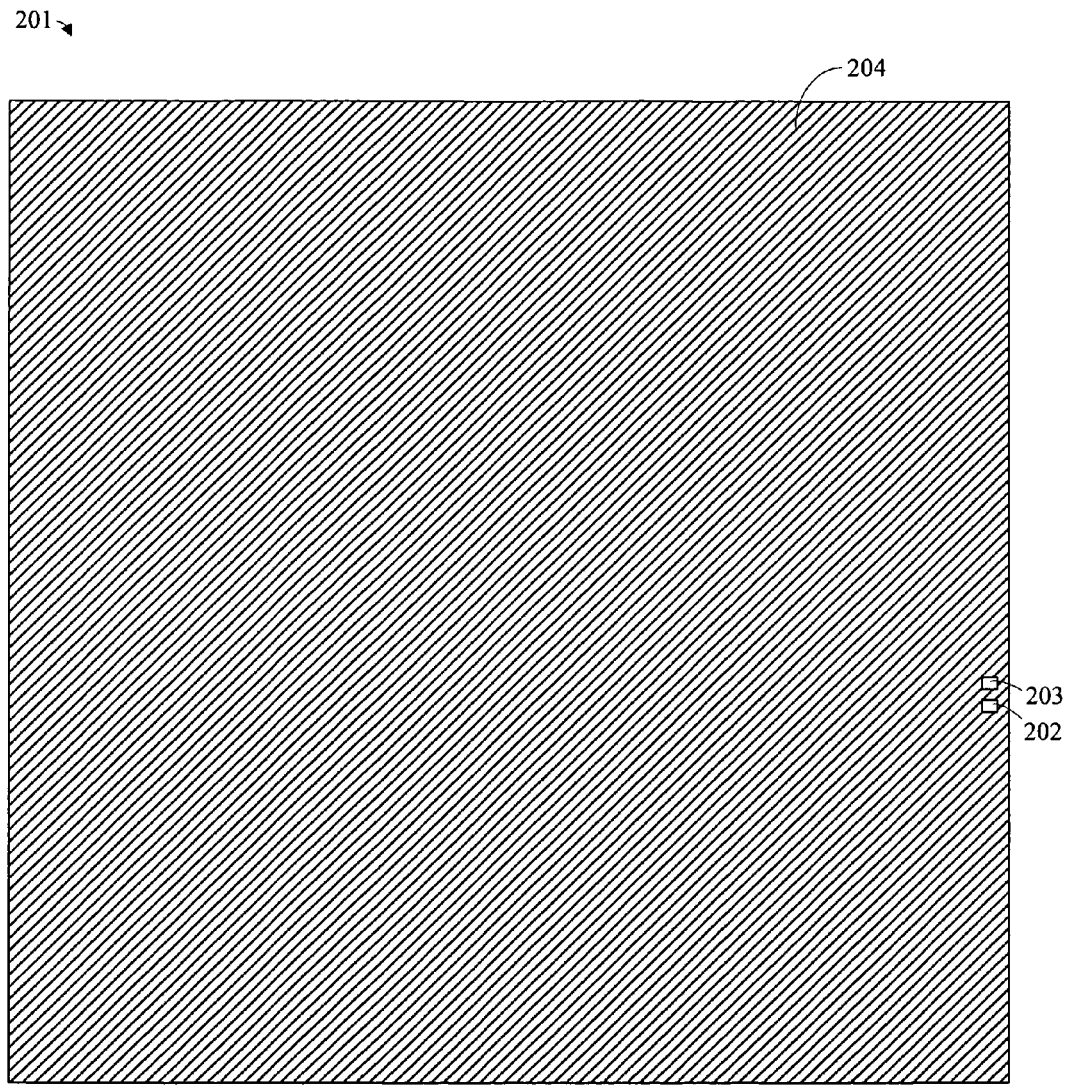
FIG. 2 is a diagram of an integrated circuit device layout that includes a device region and a verification region, with the device region and the verification region together forming a die region, in accordance with an embodiment of the present invention.

FIG. 2 shows an embodiment in which step 101 forms an integrated circuit device layout 201 that includes a verification region 202. Layout 201 also includes a device region 204 in which layer identification text 203 is located. In the present embodiment, verification region 202 is located near a side edge of layout 201, and near layer identification text 203, making it easy to locate. In the present embodiment the cells in verification region 202 are not operatively coupled together. Accordingly, all of the operable circuitry of layout 201 is contained in device region 204. Verification region 202 and device region 204 together form a die region, defining the patterns of each die region that will be subsequently formed on a semiconductor wafer.

In the present embodiment, the verification elements include cells that are duplicates of at least some of the different types of cells in device region 204. In one embodiment the verification elements include one of each type of transistor cell in device region 204, one of each type of electrical fuse cell in device region 204, one of each type of capacitor cell in device region 204 and one of each type of resistor cell in device region 204. The verification elements, in this embodiment, also include structures that are duplicates of at least some of the different types of non-cell structures in device region 204, wherein the cells and the non-cell structures in verification region 202 are not operatively coupled together.

Referring to step 102, the mask job deck is generated. A job deck is a data file that is used to control what will be printed on a mask. The term "mask," as used in the present application, includes any type of optical structure that can be used for selectively blocking light so as to form a pattern, and specifically includes photomasks and reticles that are used for forming semiconductor devices. In one embodiment the mask job deck is generated by sending the layout generated in step 101 to a photomask vendor. The layout is typically sent in the form of an electronic data file such as, for example a Graphic Data System II (GDS II) file. Upon receiving the electronic data file, the photomask vendor converts the data into a format which is compatible with the writer being used to make the mask. The mask job deck will include a plurality of mask layers, each mask layer including a verification region in which patterns corresponding to verification elements are disposed. The job deck will correspond generally to the layout generated in step 101. However, the mask job deck will also include other shapes that correspond to, and serve other, non-circuit purposes such as for lithography resolution enhancement, interlayer registration, or for other process enhancements such as planarization.

As shown by step 103 the mask job deck is verified using the patterns in the verification region. In the present embodiment the mask job deck is verified by checking mask layers for data handling errors using the patterns in the verification region. In one embodiment, the verification process of step 103 is performed in its entirety using the patterns in the verification region. In this embodiment all of the cells and structures required for the verification process in step 103 are included in verification region 202 of the layout generated in step 101.

Verification region 202 is much smaller than device region 204. In one embodiment verification region 202 has a size of approximately 35 microns by 30 microns, making it a small enough region that patterns can be easily identified. Moreover, since verification region 202 only includes a few verification elements, verification region 202 is not crowded with numerous patterns that are closely spaced together as are portions of device region 204. Because the verification elements are located together within a small, easily found location in layout 201, the engineer performing the verification will not have to search through device region 204 to locate patterns to be checked, saving considerable time and reducing the cost of the verification process. In addition, the likelihood of error is reduced since the engineer can easily determine with certainty the nature of each pattern that the engineer is viewing.

Figure 7:
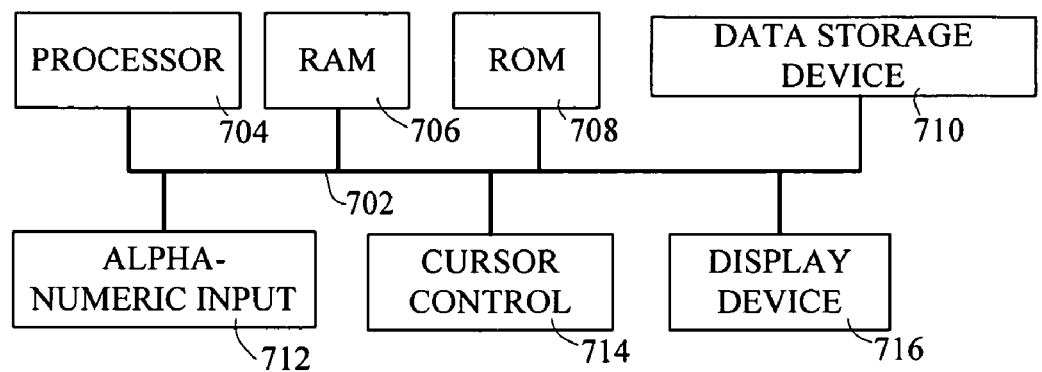
FIG. 7 is a block diagram of a computer system, in accordance with an embodiment of the present invention.

FIG. 7 illustrates an exemplary computer system 700 that can be used to perform the methods of the present invention. It is appreciated that computer system 700 of FIG. 7 is exemplary only, and that the present invention can operate within a number of different computer systems including general purpose networked computer systems, embedded computer systems, and stand alone computer systems. Additionally, computer system 700 of FIG. 7 is well adapted having computer readable media such as, for example, a floppy disk, a compact disc, and the like coupled thereto. Such computer readable media is not shown coupled to computer system 700 in FIG. 7 for purposes of clarity. Computer system 700 includes an address/data bus 702 for communicating information, and a central processor unit (PROCESSOR) 704 coupled to bus 702 for processing information and instructions. Computer system 700 also includes data storage features such as Random Access Memory (RAM) 706, coupled to bus 702 for storing information and instructions for central processor unit 704, non-volatile Read Only Memory (ROM) 708 coupled to bus 702 for storing static information and instructions for central processor unit 704, and a data storage device 710 (e.g., a hard drive or flash memory storage device) coupled to bus 702 for storing information and instructions. System 700 of the present invention also includes an alpha-numeric input device 712 and a cursor control device 714 that are coupled to bus 702 for communicating user input to central processor unit 704, and a display device 716 coupled to bus 702 for displaying information.

Figure 3:
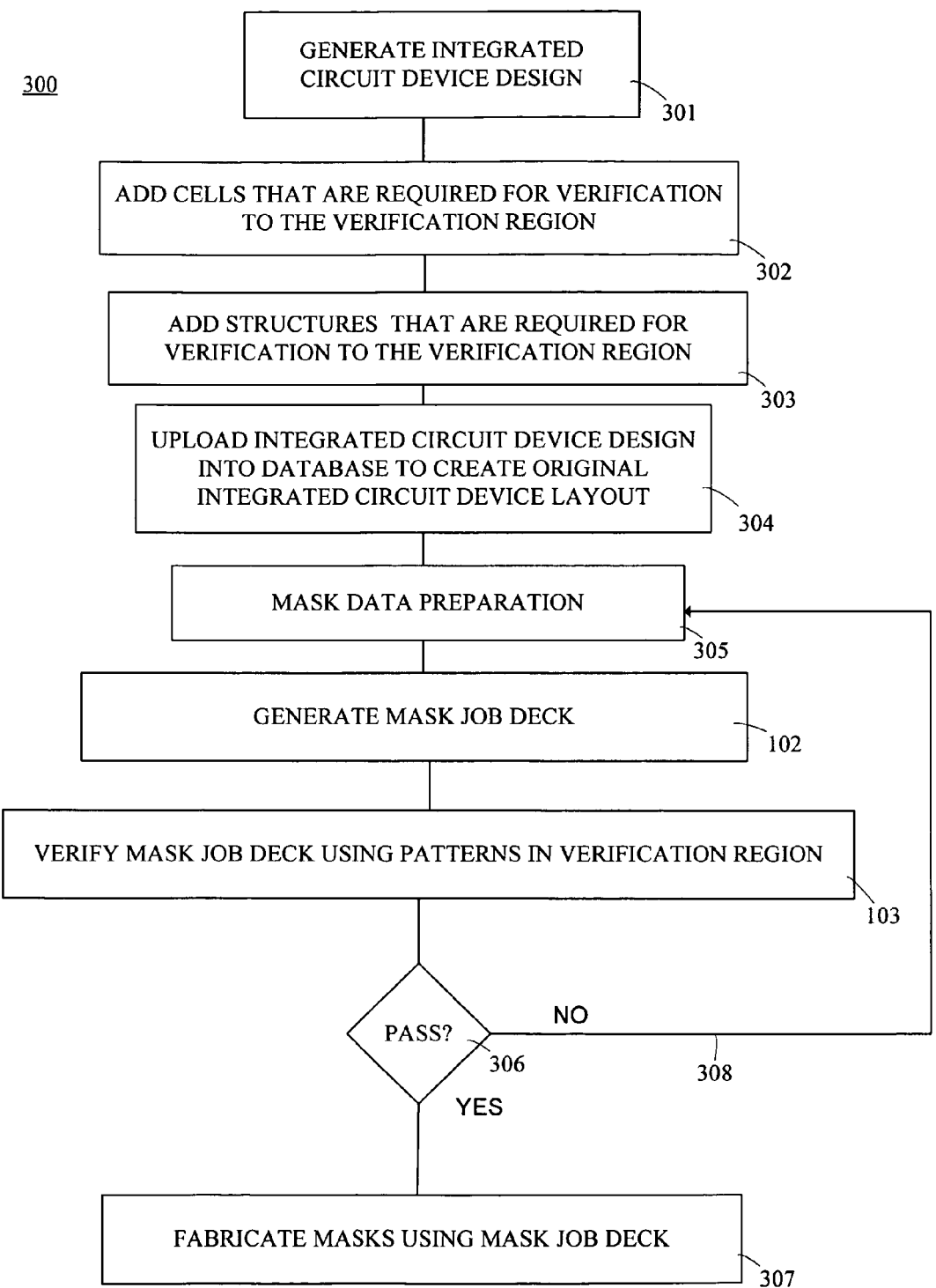
FIG. 3 is a flow chart that illustrates a method for detecting mask data handling errors in which cells that are required for verification and structures that are required for verification are added to a verification region, in accordance with an embodiment of the present invention.

FIG. 3 illustrates a method 300 for detecting mask data handling errors in accordance with an embodiment of the present invention. As shown by step 301 an integrated circuit device design is generated. Any number of known methods can be used to generate the integrated circuit device design. In one embodiment one or more portions of the integrated circuit device design are generated manually utilizing a layout editor operable on computer system 700. In one embodiment portions of the integrated circuit device design are generated using hardware description languages such as Very High Speed Integrated Circuits Description Language (VHDL), Verilog or C-derivatives, and logic synthesis tools to generate a netlist. In the present embodiment step 301 includes some or all of the following design process steps: floor planning (where the overall outlay of the design is created, including the global power and clock distribution network), placement (the positioning of cells, macrocells and/or macromodules is determined) and routing (interconnections between cells, macrocells and macromodules are wired). Also, in the present embodiment, step 301 includes the use of netlists of reused macros or previously-used structures that are inserted to form the complete netlist of the design.

In the present embodiment the integrated circuit device design includes cells that define individual integrated circuit devices and groups of individual integrated circuit devices. These cells can be from a standard cell library or can be custom cells created specifically for the integrated circuit device being designed. Typically, these cells are represented on multiple layers of the integrated circuit device design, with each layer of the integrated circuit device design including those portions of the cell that are required to implement the cell on that particular layer. In addition, in the present embodiment the integrated circuit device design will include structures such as metal interconnects, polysilicon structures, contacts, vias, etc. that couple individual cells together so as to form an operable integrated circuit device.

Figure 4:
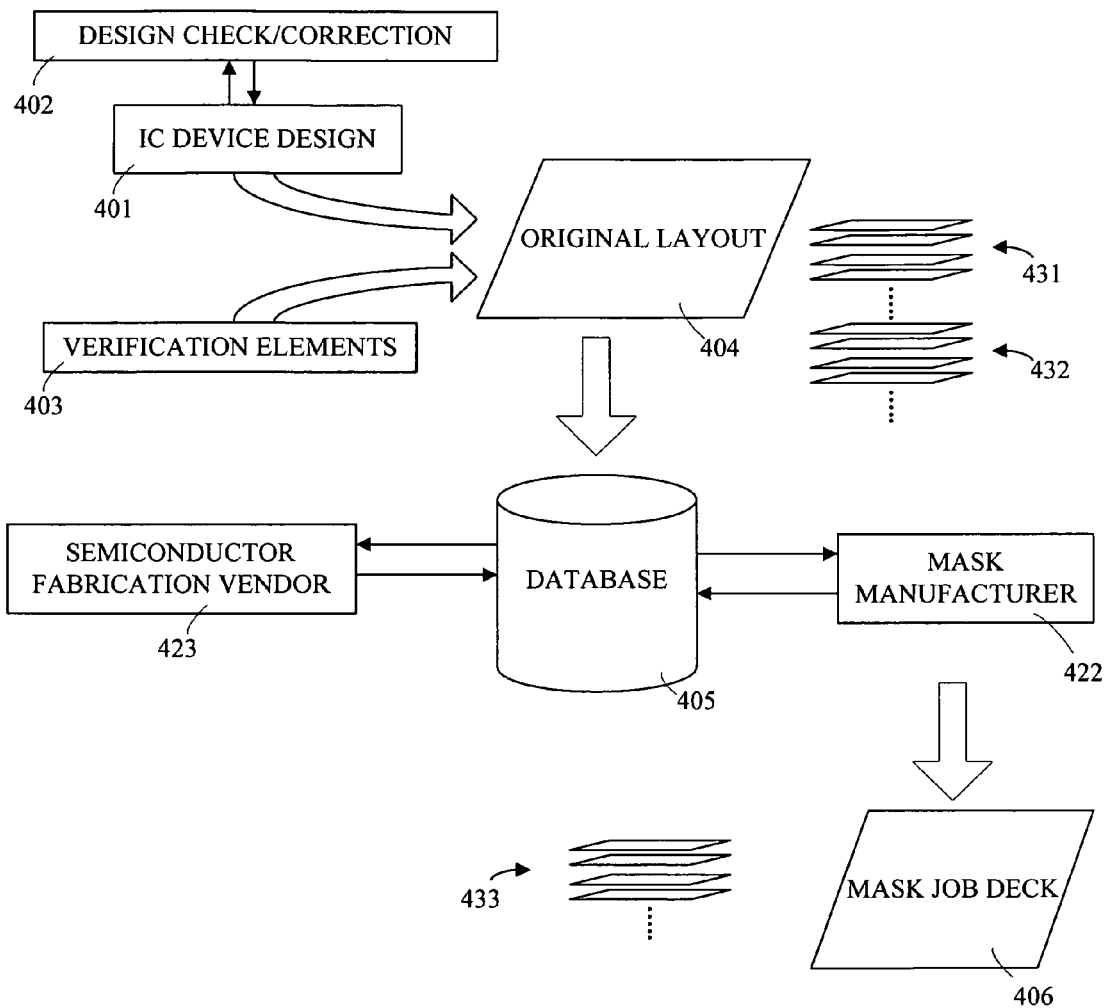
FIG. 4 is a diagram of a system for detecting mask data handling errors, in accordance with an embodiment of the present invention.

Referring now to FIG. 4 design check and correction processes 402 are performed so as to verify the accuracy of the initially generated integrated circuit device design and correct any errors detected in the integrated circuit device design. There are typically several iterations of design generation and design check/correction process 402 until a final integrated circuit device design 401 is obtained. In one embodiment design check and correction process 402 includes a Design Rule Check (DRC) process, utilizing a DRC tool that is operable on computer system 700 for ensuring that the manufacturing design will operate as intended, without any undesired short or open circuits.

In the present embodiment, step 301 forms integrated circuit device design 401 that is stored in data storage device 710 and can be manipulated using a software program operable on computing device 700 such as, for example, a layout editor. Integrated circuit device design 401 includes all of the circuitry for forming an integrated circuit device on a semiconductor wafer, which can be any type of integrated circuit device, including but not limited to a Field Programmable Gate Array (FPGA) device. In the embodiment shown in FIG. 2 integrated circuit device design 401 is laid out in device region 204 of layout 201. Accordingly, device region 204 will include all of the circuitry of integrated circuit device design 401.

Referring now to step 302, cells that are required for verification are added to the verification region. In the present embodiment step 302 is performed by identifying types of cells in integrated circuit device design 401 that are required in the verification process of step 103. One of each identified type of cell that is required for verification is added to the design by inserting it into verification region 202 of the design. The cells added in step 301 are all disposed within verification region 202 of the integrated circuit design layout and are not operationally connected to functional portions of the integrated circuit device design. In the present embodiment only those cells in the original integrated circuit design 401 that are required for verification are added to the verification region.

Figure 5:
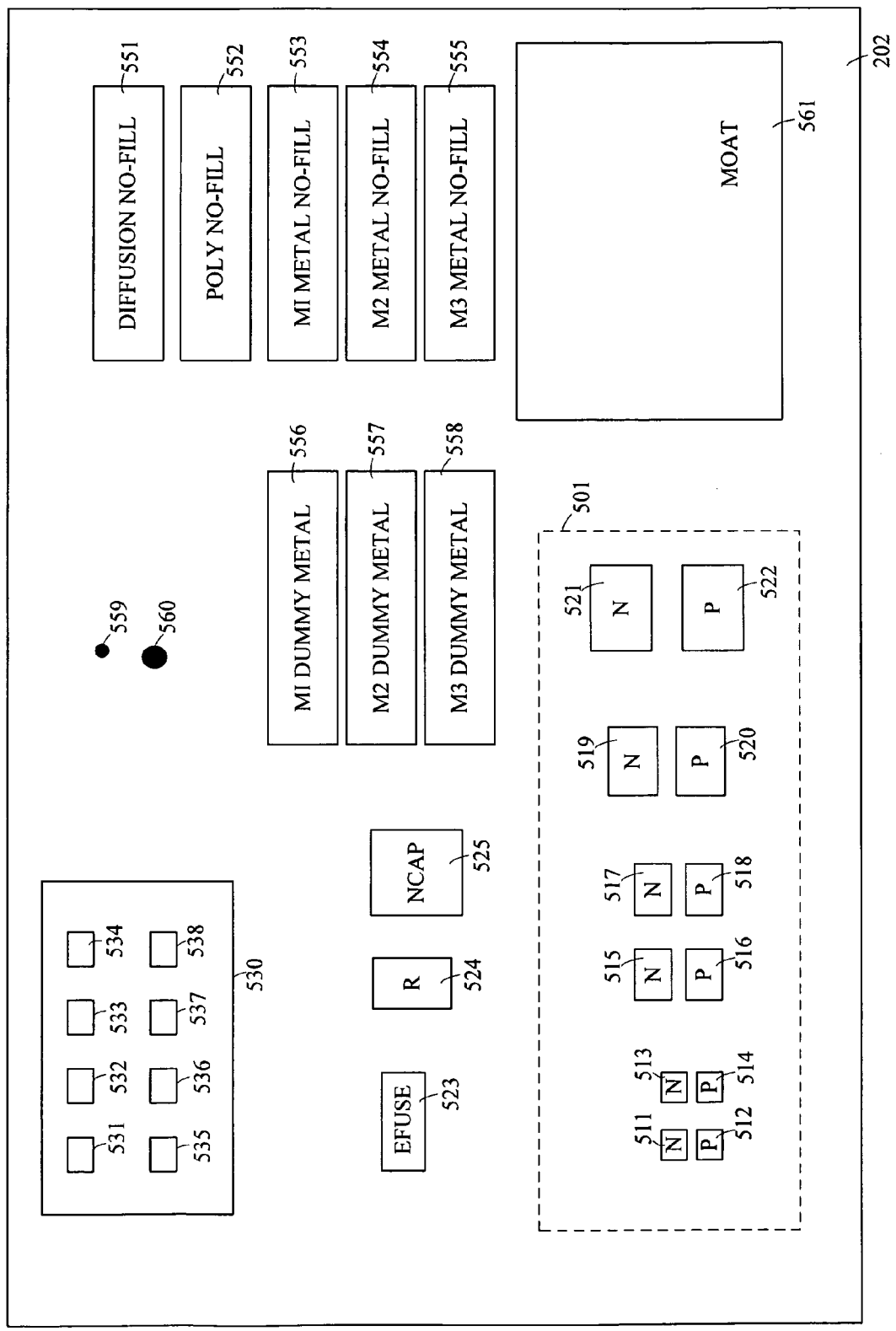
FIG. 5 is a diagram of a verification region, in accordance with an embodiment of the present invention.

In the embodiment shown in FIG. 5, step 302 forms cells 511-525 and 561 in verification region 202. More particularly, a transistor region 501 of verification region 202 is shown to include transistor cells 511-522. In one embodiment transistor cell (N) 511 is a regular-voltage N-type Metal-Oxide-Semiconductor (NMOS) transistor cell, transistor cell (P) 512 is a regular-voltage P-type Metal-Oxide-Semiconductor (PMOS) transistor cell, transistor cell (N) 513 is a low-voltage NMOS transistor cell, transistor cell (P) 514 is a low-voltage PMOS transistor cell. In the present embodiment each of transistor cells 511-514 is a duplicate of a type of transistor cell within a core region of the integrated circuit device design.

In one embodiment transistor cell (N) 515 is a regular-voltage NMOS transistor cell, transistor cell (P) 516 is a regular-voltage PMOS transistor cell, transistor cell (N) 517 is a low-voltage NMOS transistor cell and transistor cell (P) 518 is a low-voltage PMOS transistor cell. In the present embodiment each of transistor cells 515-518 is a duplicate of a type of transistor cell within a mid-oxide region of integrated circuit device design 401.

In one embodiment transistor cell (N) 519 is a regular-voltage NMOS transistor cell and transistor cell (P) 520 is a regular-voltage PMOS transistor cell. In the present embodiment each of transistor cells 519-520 is a duplicate of a type of transistor cell within a 2.5 volt input/output region of integrated circuit device design 401.

In one embodiment transistor cell (N) 521 is a regular-voltage NMOS transistor cell, transistor cell (P) 522 is a regular-voltage PMOS transistor cell. In the present embodiment each of transistor cells 521-522 is a duplicate of a type of transistor cell in a 3.3 volt input/output region of integrated circuit device design 401.

Verification region 202 also includes the following non-transistor cells: electrical fuse cell (EFUSE) 523, resistor cell (R) 524, capacitor cell (NCAP) 525 and moat cell (MOAT) 561. In the present embodiment verification region 202 includes a duplicate of every type of electrical fuse cell used in integrated circuit device design 401, a duplicate of every type of resistor cell used in integrated circuit device design 401, a duplicate of every type of capacitor cell used in integrated circuit device design 401 and a duplicate of every type of moat cell used in integrated circuit device design 401. In the present embodiment resistor cell 524 is a salicide block P+ polysilicon resistor, capacitor cell 525 is a cell that defines an N-type capacitor and moat cell 561 is a high resistance oxide cell that includes doped regions in the semiconductor substrate.

Though the present embodiment includes one of each type of cell used in integrated circuit design 401, alternatively, only some of the different types of cells in integrated circuit device design 401 are added in step 302.

In the present embodiment the cells within verification region 202 are single-device cells. The term "single-device cells" refers to cells that define a single type of integrated circuit device such as, for example, a single type of transistor, a single type of electrical fuse structure, a single type of resistor, a single type of capacitor, a single type of moat device, etc.

Referring now to step 303, structures that are required for verification are added to the verification region. In one embodiment step 303 is performed by identifying types of structures in integrated circuit device design 401, other than cells, that are required in the verification process of step 103. One of each identified type of structure that is required for verification is added to the design by inserting it into verification region 202 of layout 201. The structures added in step 303, that can be referred to as "verification structures" are all disposed within verification region 202 and are not operationally connected to functional portions of integrated circuit device design 401. In the present embodiment only those non-cell structures in the original integrated circuit design that are required for verification are added to verification region 202 in step 303. In the present embodiment the term "structures" includes not only physical structures such as interconnects, vias, contacts, etc., but also regions (e.g., polygons) within the integrated circuit device design having definable characteristics such as fill regions, no-fill regions, etc.

In the embodiment shown in FIG. 5 structures 551-560 are added to verification region 202 in step 303. Contact structure 559 defines a contact opening and via structure 560 defines a via opening. Contact structure 559 can be added to the layout by placing a contact structure within verification region 202 in each layer of the layout that defines a contact opening. Similarly, via structure 560 can be added to the layout by placing a via structure within verification region 202 in each layer of the layout that defines a via opening.

Continuing with FIG. 5, diffusion no-fill region (DIFFUSION NO-FILL) 551 is a no-fill region in the diffusion layer of the layout. In the present embodiment, diffusion no-fill regions are indicated in sub-layers of the layout by polygons, where the area within each polygon is not to receive dummy diffusion fill. In one embodiment diffusion no-fill region 551 is added by placing a polygon within verification region 202 in the layer of the layout that defines no-fill regions in a diffusion layer of the layout.

Polysilicon no-fill region (POLY NO-FILL) 552 is a no-fill region in the polysilicon layer of the layout. In the present embodiment, polysilicon no-fill regions are indicated in sub-layers of the layout by polygons, where the area within each polygon is not to receive dummy polysilicon fill. In one embodiment polysilicon no-fill region 552 is added to the layout by placing a polygon within verification region 202 in the layer of the layout that defines no-fill regions in a polysilicon layer of the layout.

Continuing with FIG. 5, verification region 202 includes metal no-fill regions 553-555. In the present embodiment, metal no-fill regions are indicated in sub-layers of the layout by polygons, where the area within each polygon is not to receive dummy metal fill. Metal no-fill region (M1 METAL NO-FILL) 553 is a no-fill region in the first metal layer of the layout. In the present embodiment metal no-fill region 553 is added by placing a polygon within verification region 202 in the layer of the layout that defines no-fill regions in a first metal layer of the layout. Metal no-fill region (M2 METAL NO-FILL) 554 is a no-fill region in the second metal layer of the layout. In the present embodiment metal no-fill region 554 is added by placing a polygon within verification region 202 in the layer of the layout that defines no-fill regions in a second metal layer of the layout. Similarly, metal no-fill region (M3 METAL NO-FILL) 555 is a no-fill region in the third metal layer of the layout that can be added by placing a polygon within verification region 202 in the layer of the layout that defines no-fill regions in a third metal layer of the layout.

Verification region 202 also includes dummy metal regions 556-558. In the present embodiment, dummy metal regions are indicated in sub-layers of the layout by openings in metal no-fill layers. These openings can receive metal fill when metal fill is applied. In the present embodiment dummy metal region (M1 DUMMY METAL) 556 is a dummy metal region in the first metal layer of the layout. Dummy metal region (M2 DUMMY METAL) 557 is a dummy metal region in the second metal layer of the layout. Similarly, dummy metal region (M3 DUMMY METAL) 558 is a dummy metal region in the third metal layer of the layout.

Figure 6:
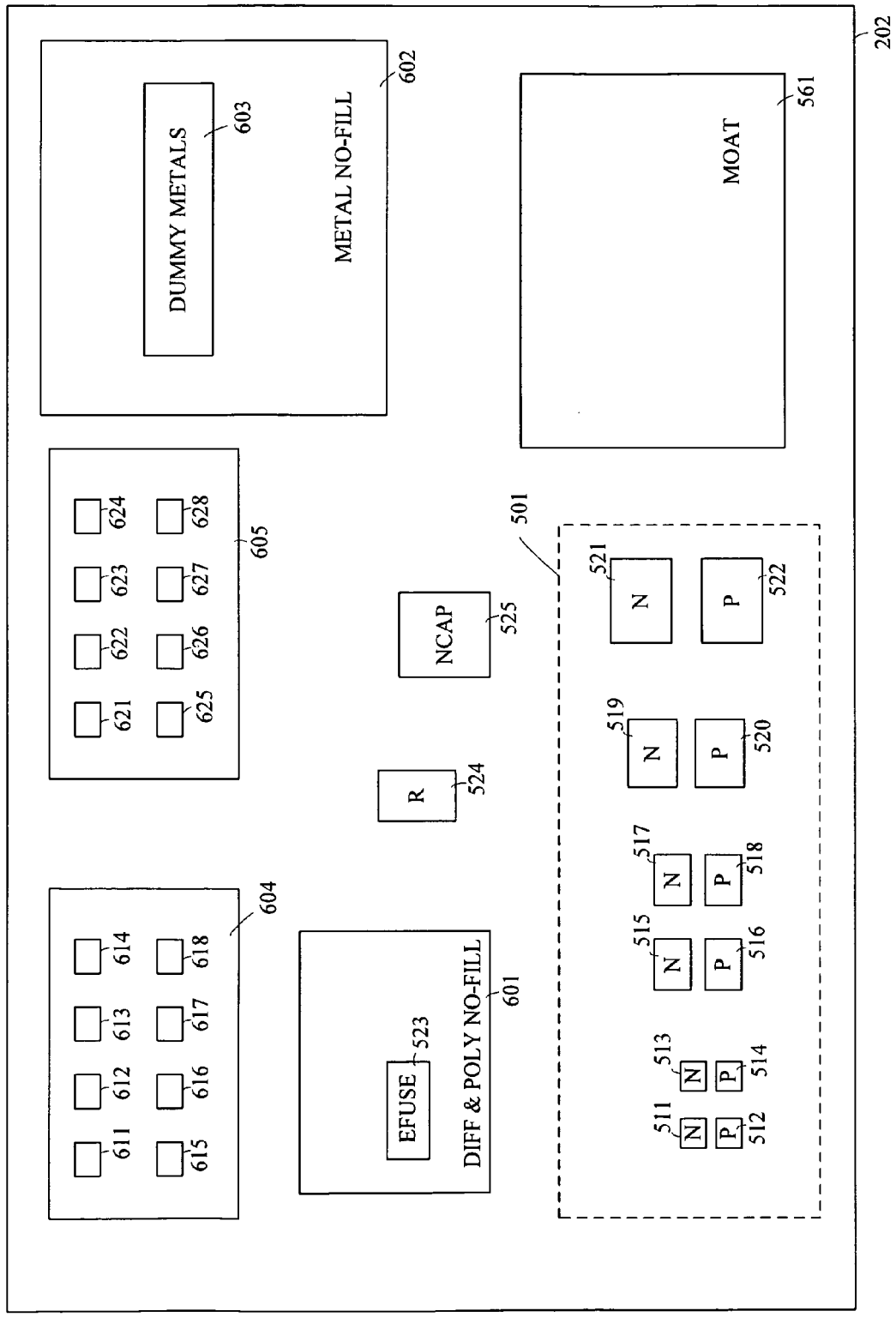
FIG. 6 is a diagram of a verification region in which some verification cells and verification structures are overlain, in accordance with an embodiment of the present invention.

In the embodiment shown in FIG. 5, fill regions 556-558 and no-fill regions 551-555 for each layer are shown as separate polygons in verification region 202. In another embodiment that is shown in FIG. 6, some fill regions and some no-fill regions overlap. Not only does this allow for larger and more easily viewed fill and no-fill regions, but it allows for accommodating designs having a large number of metal layers.

In the embodiment shown in FIG. 6, a no-fill region (DIFF & POLY NO-FILL) 601 is shown that includes both a diffusion no-fill region and a polysilicon no-fill region that overlap. In the present embodiment no-fill region 601 is formed by placing a polygon in verification region 202 in the layer of the layout that defines no-fill regions in a diffusion layer of the layout. A second polygon, which is identical in size and placement is placed in the layer of the layout that defines no-fill regions in a polysilicon layer of the layout.

In the embodiment shown in FIG. 6, electrical fuse cell 523 is disposed within no-fill region 601. This is advantageous in that it conserves space within verification region 202.

Continuing with FIG. 6, a metal no-fill region (METAL NO-FILL) 602 is shown that includes a plurality of metal no-fill regions that overlap. In the present embodiment metal no-fill region 602 includes a metal no-fill region for each metal layer in the original layout 404. Metal no-fill region 602 can be formed by placing a polygon in verification region 202 in each layer of the layout that defines no-fill regions in a metal layer of the layout. In the present embodiment these polygons are identical in size and placement.

Continuing with FIG. 6, a dummy metal region (DUMMY METALS) 603 is shown that includes a plurality of dummy metal regions that overlap. In one embodiment dummy metal region 603 includes dummy metals for each metal layer in the layout in which dummy metals are inserted. Dummy metal region 603 can be formed by placing a corresponding open region in verification region 202 in each layer of the layout that defines no-fill regions in a metal layer of the layout. In the present embodiment these open regions are identical in size and placement and extend within metal no-fill region 602.

The embodiment shown in FIG. 6 does not include contact structure 559 or a via structure 560. In this embodiment, contact structures and via structures are not required in the verification process of step 103.

In the embodiment shown in FIG. 4, steps 302-303 are shown to form verification elements 403. In one embodiment computer system 700 is used to form verification elements 403. More particularly, an engineer utilizing alpha-numeric input device 712 and/or cursor control device 714 adds cells and structures to the design using, for example, a layout editor. In one embodiment, steps 302-303 are performed by adding a cell to the design that includes the required verification elements. This cell, referred to hereinafter as a "job deck view cell," can be defined using a smaller netlist, referred to hereinafter as a "verification netlist" that defines the design of the verification region. In one embodiment steps 302-303 include generating a verification netlist and inserting the verification netlist during the process of generating the final netlist such that the final netlist includes both the netlist of the integrated circuit design and the verification netlist.

The integrated circuit device design is then uploaded into a database to create an integrated circuit device layout as shown by step 304. In one embodiment a computer program that is operable on processor 704 performs operations on the final netlist to generate the integrated circuit device layout that is stored in data storage device 710.

Though steps 302-303 were previously described as being performed after step 301 and after creation of an initial integrated circuit device design, it is appreciated that steps 302-303 can be performed prior to step 301. In one embodiment, steps 302-303 are performed by adding a previously generated verification cell that is defined by a previously generated verification netlist, to the netlist that includes the integrated circuit device design. Thereby, previously generated verification cells and verification netlists can be reused, saving the time and expense of generating a new verification cell and verification netlist each time that a new integrated circuit device design is formed.

In the embodiment shown in FIG. 4, steps 301-304 form an original integrated circuit device layout (ORIGINAL LAYOUT) 404 that is stored in database 405. In the present embodiment original layout 404 is a hierarchical database that includes both design layers 431 and other types of layers, typically referred to as "sub-layers" that are shown collectively as sub-layers 432. Design layers 431 indicate the structures to be formed on each layer of the semiconductor wafer. Sub-layers 432 can be blank, reserved for subsequent operations or can include text that relates to one or more design layer 431. In addition, sub-layers 432 can include structures that are to be combined with a particular design layer 431 to form a particular mask.

In the present embodiment some of sub-layers 432 are no-fill layers that define regions of individual design layers 431 that are not to receive dummy fill structures. In the present embodiment each no-fill layer includes polygons that indicate regions of an associated design layer 431 that are not to receive dummy fill. In one embodiment, dummy fill features are added to some layers during the process of generating the integrated circuit device design 401 such that original layout 404 includes the required dummy fill features on some of layers 431-432.

Figure 9:
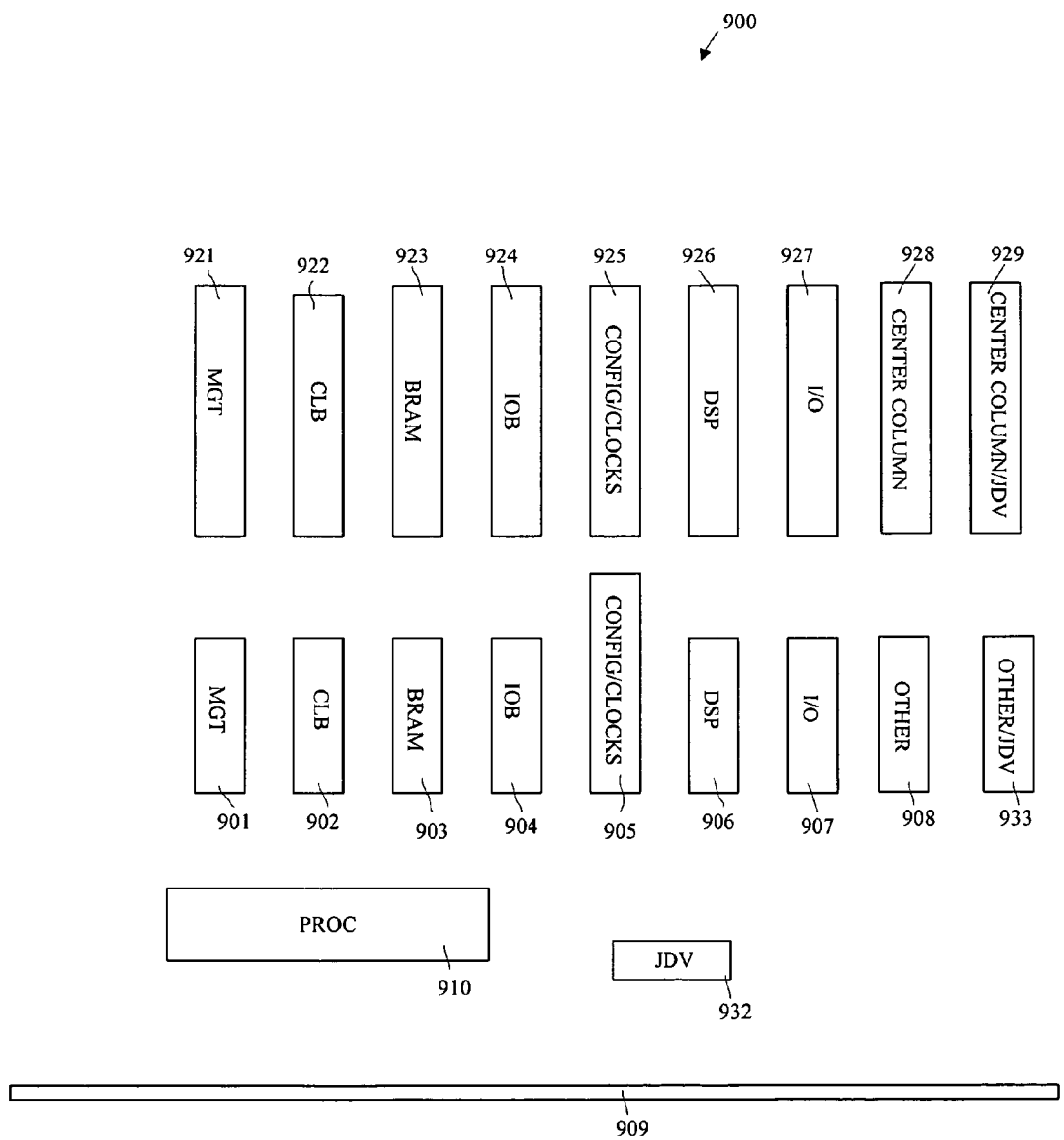
FIG. 9 is a block diagram of integrated circuit design library for forming programmable logic devices, the library including programmable logic block tiles, columns of programmable logic blocks, a programmable logic block tile that includes a verification region and a column of programmable logic blocks that includes a verification region, in accordance with an embodiment of the present invention.

FIG. 9 shows exemplary cells in a library 900 for forming a Programmable Logic Device (PLD) such as a Field Programmable Gate Array (FPGA). Library 900 includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907) (e.g., configuration ports and clock ports), and other programmable logic (OTHER) 908 such as digital clock managers, analog-to-digital converters, system monitoring logic, and so forth. In the present embodiment tiles 901-908 include individual integrated circuit device cells 511-525 and 561 and structures such as contacts, vias, interconnects, no-fill regions, dummy metal regions, etc.

Library 900 also includes columns 921-927 having substantially identical tiles of the associated circuit type. More particularly, column 921 is a column of MGT tiles, column 922 is a column of CLB tiles, column 923 is a column of BRAM tiles, column 924 is a column of IOB tiles, column 925 is a column of configuration and clock tiles, column 926 is a column of DSP tiles and column 927 is a column of input and output tiles. Center column 928 is a column that is made up of multiple different types of tiles. In the present embodiment, center column 928 includes configuration and clock tiles 905, input and output tiles 907 and other programmable logic 908 and 933.

Library 900 includes dedicated processor blocks (PROC 910), configuration and clock distribution blocks 909. In addition, library 900 includes Job Deck View (JDV) cell 932 that defines verification region 202 shown in FIG. 6, center column (CENTER COLUMN/JDV) 929 that includes a verification region 202 and other programmable logic (OTHER/JDV) 933 that includes a verification region 202. In the present embodiment center column 929 is identical to center column cell 928 except that it includes a verification region 202 within an unused region of center column 928, and other programmable logic block 933 is identical to other programmable logic block 908 except that it also includes a verification region 202 within an unused region of other programmable logic block 908.

In one embodiment library 900 is used to generate an original integrated circuit device layout 404 that defines a FPGA. In this embodiment columns 921-929 and/or programmable logic blocks 901-910 and 933 are selected and are laid out using a layout editor. Verification elements can be added to the layout by selecting a column (e.g., center column 928) that includes a verification region 202, a programmable logic block (e.g., other programmable logic block 933) that includes a verification region 202, or by placing JDV cell 932 into the layout.

Figure 10:
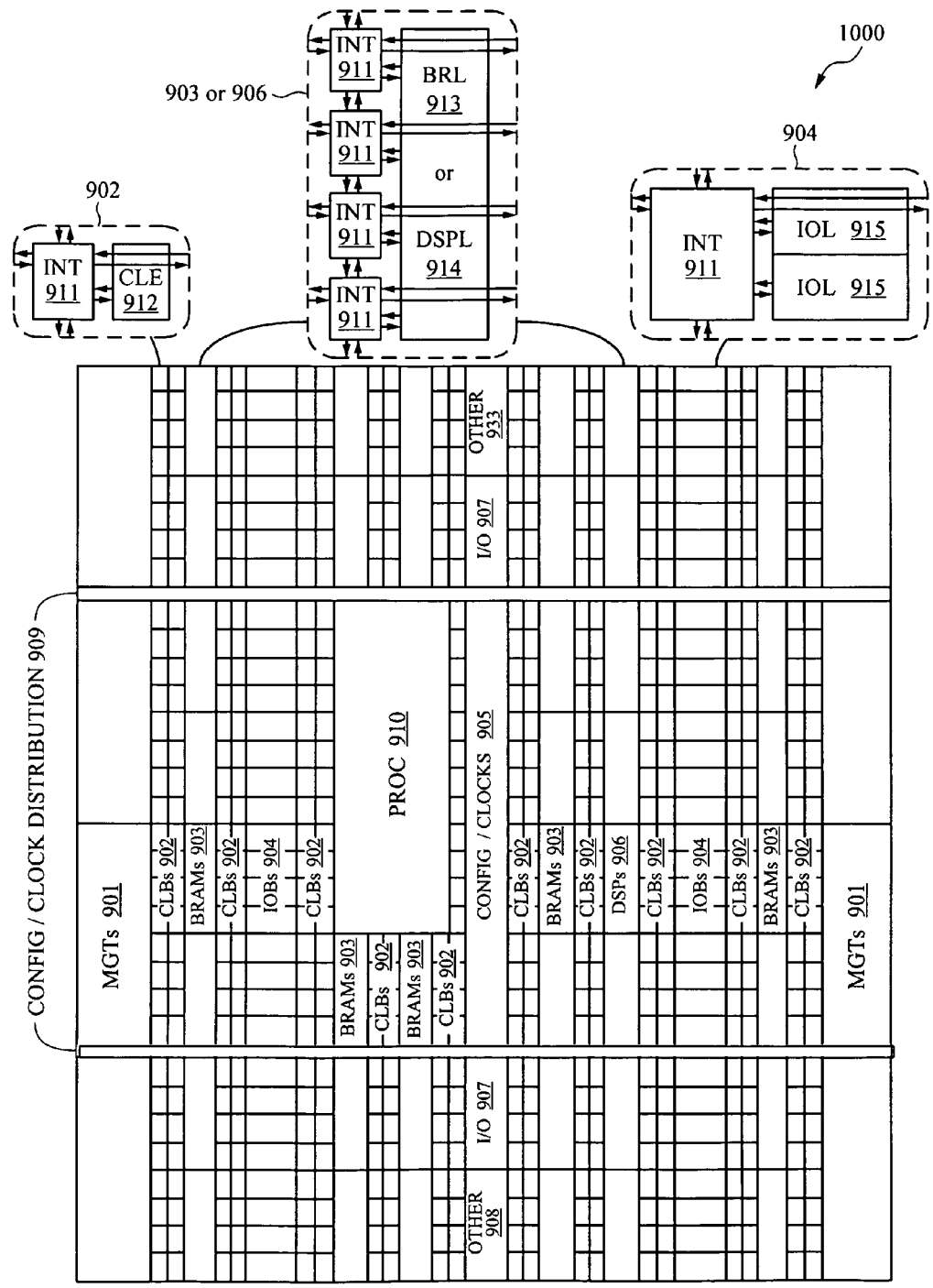
FIG. 10 is a diagram of an integrated circuit device layout that forms a field programmable gate array device and that includes a verification region, in accordance with an embodiment of the present invention.

FIG. 10 shows an exemplary FPGA device layout 1000 that can be formed using library 900. In this embodiment the verification region is added to the layout by including other programmable logic block 933 that includes a verification region 202. In the present embodiment, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element (INT 911) also includes the connections to and from the programmable logic element within the same tile, as shown by the examples included at the top of FIG. 10.

For example, a CLB 902 can include a configurable logic element (CLE 912) that can be programmed to implement user logic plus a single programmable interconnect element (INT 911). A BRAM 903 can include a BRAM logic element (BRL 913) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 906 can include a DSP logic element (DSPL 914) in addition to an appropriate number of programmable interconnect elements. An IOB 904 can include, for example, two instances of an input/output logic element (IOL 915) in addition to one instance of the programmable interconnect element (INT 911). As will be clear to those of skill in the art, the actual I/O pads connected, for example, to the I/O logic element 915 are manufactured using metal layered above the various illustrated logic blocks, and typically are not confined to the area of the input/output logic element 915.

In the pictured embodiment, a columnar area near the center of the die (shown shaded in FIG. 10) is used for configuration, clock, and other control logic. Horizontal areas 909 extending from this column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, processor block PROC 910 spans several columns of CLBs and BRAMs.

Note that FIG. 10 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Referring back to FIG. 3, mask data preparation is performed as shown by step 305 and a mask job deck is generated as shown by step 102. In one embodiment a mask manufacturer 422 performs mask data preparation and generates mask job deck 406. In this embodiment, electronic files that represent design layers 431 and related sub-layers 432 are sent to mask manufacturer 422 (e.g., GDS II files) who then performs required mask data preparation operations and generates mask job deck 406. In one embodiment mask job deck 406 is formed using a computer system 700 located at the facilities of mask manufacturer 422 and is stored in a mask design database in data storage device 710 at the facilities of mask manufacturer 422. In one embodiment, after creation of the job deck, mask manufacturer 422 performs an internal mask verification process to make sure that the generated mask data files correctly represent the received data files.

After steps 305 and 102 are performed, the mask manufacturer sends electronic copies of the mask job deck to the customer for the purpose of mask verification. In the present embodiment the received mask job deck is stored in database 405.

In one embodiment the mask data preparation operations of step 305 include the addition of shapes that serve other, non-circuit purposes such as, for example, lithography resolution enhancement, interlayer registration, or for other process enhancements such as planarization. In the present embodiment, step 305 includes operations on the data to correct for optical proximity effects, image distortion, etc. In addition, step 305 can include adding sub-resolution assist features and creation of phase shift masks to provide for enhanced feature definition. In the present embodiment mask data preparation of step 305 also includes the addition of non-circuit features such as fill layers.

In one embodiment a preliminary mask job deck is formed in step 305 by operation of a mask program on original layout 404. The mask program is operable to apply mask format rules and methodology so as to form the preliminary mask job deck. The operations of step 305 change at least some of the layers of the preliminary mask job deck to create final mask job deck (MASK JOB DECK) 406 that will be used to fabricate masks for forming an integrated circuit device. Mask job deck 406 includes a plurality of mask-level layout layers, generally referred to as "mask layers" 433 that will be used to define photomasks.

In one embodiment masks are to be fabricated using a Moving Electron Beam Exposure System (MEBES). In this embodiment mask job deck 406 includes MEBES pattern generation files where each mask layer 433 is represented by a single MEBES pattern generation file. Though mask layers 433 will correspond generally to layers 431 and 432 of the layout generated in step 101, mask layers 433 will also include additional shapes. Moreover, the original shapes may be changed as a result of the processes of steps 102 and 305.

A software program, referred to hereinafter as a verification program, allows for viewing the features of mask job deck 406. In one embodiment the verification program is stored in data storage device 710 is operable on computing device 700, and allows for viewing the mask job deck 406 on a display device such as display device 716. In the present embodiment, in addition to viewing the mask job deck 406, the mask verification program allows for viewing the other features in database 405, including original layout 404, and additions and changes to original layout 404. In some embodiments of the present invention the verification program is operable for importing data from and exporting data to mask manufacturer 422 and semiconductor fabrication vendor 423.

Continuing with FIG. 3, the mask job deck is verified (step 103) using the patterns in the verification region. In one embodiment each mask layer 433 to be verified is rendered electronically into an image file that can be viewed on a computer and generates a viewable image on the computer that is commonly referred to as a "job deck view." In one embodiment alpha-numeric input 712 and cursor control 714 are used to generate an image on display device 716 of the mask layer 433 to be verified. The engineer moves within the image file to display verification region 202 on display device 716. The engineer performing the verification process visually inspects the job deck view on a computer, checking each required structure. This process is repeated for each layer to be checked until the entire job deck has been verified.

In the present embodiment verification process includes, for each layer, viewing patterns in verification region 202 to check mask tone. Alternatively, patterns of layer identification text 203 can be used for checking mask tone. If the mask tone is incorrect, a mask data handling error has occurred since the mask manufacturer 422 has applied the wrong tone.

For mask layers in which feature width is to be checked, the width of certain patterns in verification region 202 are measured to make sure that the correct width is maintained. In a process typically referred to as "transistor polysilicon sizing" the width of certain patterns in the polysilicon layer are measured, including checking whether the patterns that should have a certain critical dimension width have the required critical dimension width. If the width of a measured pattern is outside of the required tolerance, a mask data handling error has occurred since the mask manufacturer 422 has incorrectly sized one or more layers or has improperly applied optical proximity correction.

Boolean generations are also checked. In the present embodiment checking feature width and checking Boolean generations are performed entirely using patterns in verification region 202, and not using patterns in device region 204. In the present embodiment the Boolean generation checking process includes viewing the patterns of each transistor and patterns of each non-transistor cell to make sure that all required patterns are present. In one embodiment this process is facilitated using a truth table in which verification cells are listed on a horizontal axis and mask layers 433 are listed on a vertical axis, and in which an "X" is placed to indicate where patterns corresponding to verification cells should be found. In FIG. 5, cells 511-525 and 561 are visually checked, using the truth table, to make sure that all required patterns are present. Moreover, the patterns of structures such as contact structure 559 and via structure 560 are checked to make sure that they are present. The process of checking Boolean generations also includes checking mask layers to make sure that fill patterns are present where required and to make sure that fill patterns are not placed in regions in which fill is not required. In the embodiment shown in FIG. 5, dummy fill regions 556-558 and no-fill regions 551-555 are viewed to check that fill has been properly included and that all required fill and no-fill layers 431-432 have been included. When a required pattern is not present, or when a pattern is present that should not be in a particular mask, a mask data handling error has occurred because the mask manufacturer 422 has either included a layer 431-432 that should not be included or omitted a layer 431-432 that should have been included.

In the present embodiment metal layers are viewed to check metal cheesing. In one embodiment the patterns of contact structure 559 and via structure 560 are checked, along with any overlying metallization that extends across verification region 202. If metal cheesing is found, a mask data handling error has occurred since the mask house has incorrectly rendered a structure.

In one embodiment, checking Boolean generations and transistor polysilicon sizing are performed entirely using the verification region. More particularly, checking Boolean generations is performed by generating a display of verification region 202 and visually checking the patterns in verification region 202 and not visually checking patterns in device region 204. Similarly, checking transistor polysilicon sizing is performed by generating a display of verification region 202 in the polysilicon layer and visually checking the patterns in verification region 202 and not visually checking patterns in device region 204.

In one embodiment, in addition to using patterns in verification region 202, patterns not located in verification region 202 can be used to perform the verification process of step 103. For example, checking mask tone can be performed by checking layer identification text 203. In addition, metal cheesing can be checked by viewing structures in metal layers that are outside of verification region 202.

Verification region 202 allows the engineer to verify each layer without having to search through device region 204 to find instances of patterns corresponding to verification elements that are contained within device region 204, saving a considerable amount of engineer time and reducing the cost of the verification process. In addition, the likelihood of error is reduced since the engineer can easily determine with certainty the type of cell or structure that corresponds to each pattern.

Once the verification process of step 103 is complete, if a mask data handling error is discovered, mask data preparation steps are performed again to correct the error as shown by line 308. If mask data handling errors are not found, the mask job deck passes the verification process and the masks are fabricated using the mask job deck as shown by steps 306-307. In the embodiment shown in FIG. 4, approval of the mask job deck is provided to mask vendor 422 and the masks are fabricated using mask job deck 406.

In one embodiment the verification process of step 103 is performed manually for a first product tape-out and is performed in an automated manner for subsequent product tape-outs for related products in a family of products. More particularly, in one embodiment, a first product is designed and a first mask job deck layout is generated that includes a first verification region. In a subsequent design that is for a similar product within a family of related products an automated process is used to determine whether a mask data handling error has occurred. This is particularly useful for products such as FPGA devices, since subsequent product designs often use the same or similar cells and non-cell structures.

In one embodiment the layout of the verification region of a first product is identical to the layout of a verification region of subsequent products in a product family. In this embodiment the patterns in the verification region of the first product are checked manually and an image file of the patterns in the verification region of the first product is generated. The image file of the patterns in the verification region of the first product, referred to hereinafter as a "first verification region image file" is stored in data storage device 710. For a second product design that includes an identical verification region layout, a computer program operable on computer system 700 is operable to automatically generate an image file of the patterns in the verification region of the second product (a second verification region image file) that can also be stored in data storage device 710. The computer program is operable to automatically verify the second product by comparing the first verification region image file to the second verification region image file. In the present embodiment this comparison is an "xor" process in which each pattern in the first verification region image file is compared to the same region of the second verification region image file. If all patterns are present the xor process results in a 0 outcome, indicating that there are no differences between the images in the first verification region image file and the second verification region image file.

In one embodiment, for each region in the first verification region image file that includes a pattern, a size test and a tone test are performed on the corresponding location in the second verification region image file, determining whether a corresponding pattern is present in the second verification region image file having the same size and tone. This process is repeated for each feature in the first verification region image file until all features have been compared. If, for each feature in the first verification region image file, there is a corresponding feature in the second verification region image file having the same size and tone, the mask job deck for the second product passes verification. In one embodiment a comparison is also performed to make sure that there are no patterns in the second verification region image file that are not present in the first verification region image file. If patterns are found in the second verification image file that are not present in the first verification region image file a mask data handling error has occurred. The automated verification process allows for easily determining whether a verification error has occurred in each product's mask job deck in the product family, significantly reducing the time required for verification and the cost of verification.

In one embodiment verification region 202 includes revision regions that indicate revisions occurring after the manufacture of the first set of masks. In this embodiment, structures are added to layers of the layout that have been changed to indicate the corresponding mask layers 433 that have changed. More particularly, each time there is a revision after the manufacture of the first set of masks, structures are added to the revision regions in the layout to indicate layers that have changed.

In the embodiment shown in FIG. 5 a change region 530 is shown that includes revision regions 531-538. In this embodiment revision region 531 indicates a first revision, revision region 532 indicates a second revision, revision region 533 indicates a third revision, revision region 534 indicates a fourth revision, revision region 535 indicates a fifth revision, revision region 536 indicates a sixth revision, revision region 537 indicates a seventh revision and revision region 538 indicates an eighth revision. Each time that a layer 431-432 is changed after the manufacture of the first set of masks, a structure is added to the corresponding revision region 531-538 in the layer in the layout that is changed. The structure can be a simple polygon or other shape that is added to fill a revision region 531-538. More particularly, for layout layers changed in a first design revision, a polygon is added in revision region 531 of each layer 431-432 that is changed. Similarly, for the second design revision, polygons are added in revision region 532 of each layer 431-432 that is changed. For the third design revision, polygons are added in revision region 533 of each layer 431-432 that is changed. This same process in the fourth through eighth revisions, adding structures to revision regions 534-538 of layers that are changed The embodiment in FIG. 6 includes two change regions, a first change region 604 that indicates changes to contact and via layers and a second change region 605 that indicates changes to diffusion, polysilicon and metal layers. In this embodiment revision regions 611 and 621 indicate a first revision, revision regions 612 and 622 indicate a second revision, revision regions 613 and 623 indicate a third revision, revision regions 614 and 624 indicate a fourth revision, revision regions 615 and 625 indicate a fifth revision, revision regions 616 and 626 indicate a sixth revision, revision regions 617 and 627 indicate a seventh revision and revision regions 618 and 628 indicate an eighth revision. Each time that a layer 431-432 is changed after the manufacture of the initial set of masks, if the layer is a contact or via layer, a structure is added to the corresponding revision region 611-618 in the layer in the layout that is changed. More particularly, for contact and via layers changed in a first design revision, a polygon is added in revision region 611 of each layer 431-432 that is changed. For diffusion, polysilicon and metal layers changed in a first design revision, a polygon is added in revision region 621 of each layer 431-432 that is changed. Similarly, for contact and via layers changed in a second design revision, a polygon is added in revision region 612 of each layer 431-432 that is changed. In one embodiment when a change is to a layer that defines a contact opening the structure that is added is a contact (e.g., contact structure 559) and when the change is to a layer that defines a via opening the structure that is added is a via (e.g., via structure 560). For diffusion, polysilicon and metal layers changed in a first design revision, a polygon is added in revision region 621 of each layer 431-432 that is changed. The same procedure is used for subsequent revisions, indicating layers 431-432 that have been changed.

During the final verification process for each revision occurring after the manufacture of the first set of masks, the patterns in revision regions are checked to determine whether a mask data handling error has occurred. For example, in the embodiment of FIG. 5, prior to approving manufacture of a set of masks for a first revision, if a revision region 531 for a mask layer that has been changed does not include a structure, the mask house may have failed to include that layer. The final verification process for these subsequent job decks is a simple check process, either the required structure is present or it is not. If it should be present and it is not, a mask data handling error has occurred.

In this embodiment the verification process of step 103 includes, for each revision after the manufacture of the first set of masks, checking the revision regions for that revision and revision regions for any previous revisions, to verify that all revision regions for mask layers that have been changed include a pattern. In one embodiment this process is automated using a computer program that is operable on computing system 700, with the computer program checking in an automated manner to determine whether patterns are present in each revision region that should include a pattern.

Figure 8:
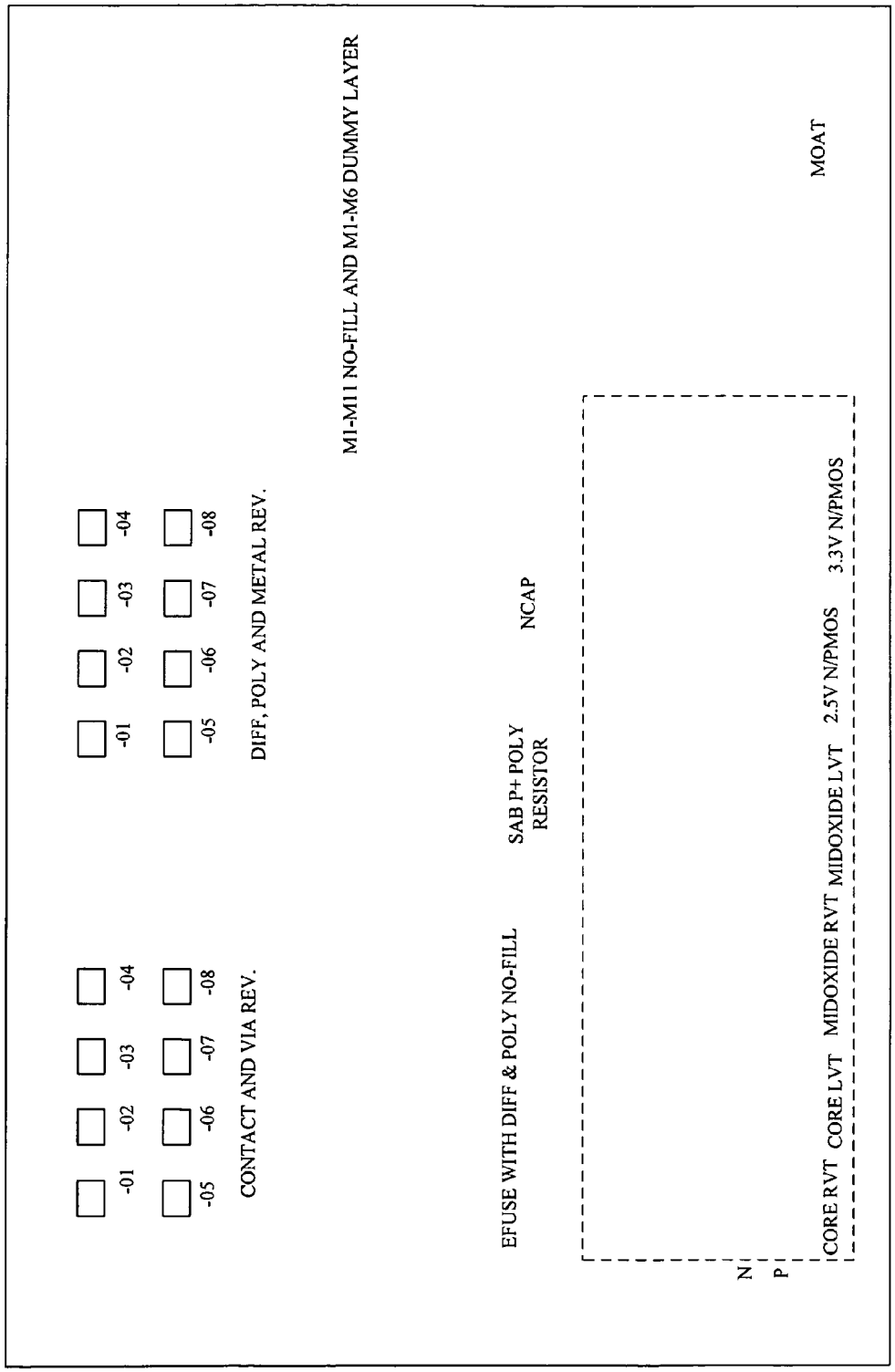
FIG. 8 is a diagram of a data layer that indicates, using rectangles and text, the revision regions, cells and non-cell structures of FIG. 6, in accordance with an embodiment of the present invention.

In one embodiment that is illustrated in FIG. 8 a data layer in database 405 allows for selecting a text overlay 801 that identifies the location of the verification elements. In the present embodiment text overlay 801 includes rectangles and text identifying revision regions, cells and non-cell structures. This makes identification of patterns easier and further reduces the chance of error in the final verification process.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An integrated circuit device comprising:
a device region in which operable circuitry is disposed; and
a verification region in which verification elements are disposed, the verification elements including cells that are duplicates of at least some of different types of cells in the device region, wherein the cells in the verification region are not operatively coupled together,
wherein the verification region includes revision regions in which structures are added to indicate revisions occurring after the manufacture of a first set of masks, wherein the structures that are added to the revision regions are added to layers of the integrated circuit device that have been changed.

2. The integrated circuit device of claim 1 wherein the verification elements include structures that are duplicates of at least some of different types of non-cell structures in the device region, wherein the cells and the non-cell structures in the verification region are not operatively coupled together.

3. The integrated circuit device of claim 2 wherein the verification elements include one of each type of transistor cell in the device region.

4. The integrated circuit device of claim 3 wherein the verification elements include one of each type of electrical fuse cell in the device region.

5. The integrated circuit device of claim 4 wherein the device region comprises a field programmable gate array device.

6. A method for detecting mask data handling errors comprising:
- generating, using a processor, an integrated circuit device layout in a database, the integrated circuit device layout including a device region and a verification region in which verification elements are disposed, the verification elements including cells that are duplicates of at least some of different types of cells in the device region, wherein the cells in the verification region are not operatively coupled together; and
- verifying a mask job deck using patterns in the verification region,
- wherein the verification region includes revision regions in which structures are added to indicate revisions occurring after the manufacture of a first set of masks, wherein the structures that are added to the revision regions are added to layers of the integrated circuit device that have been changed.

7. The method of claim 6 wherein the mask job deck includes a plurality of mask layers, each mask layer including a verification region in which patterns corresponding to verification elements are disposed, and wherein verifying a mask job deck further comprises checking mask layers for data handling errors using the patterns in the verification region.

8. The method of claim 7 wherein the verification elements include non-cell structures that are duplicates of at least some of different types of non-cell structures in the device region, wherein the cells and the non-cell structures in the verification region are not operatively coupled together.

9. The method of claim 8 wherein the checking mask layers for data handling errors comprises checking Boolean generations and checking transistor polysilicon sizing.

10. The method of claim 9 wherein the checking Boolean generations is performed by generating a display of the verification region and visually checking the patterns in the verification region and not visually checking patterns in the device region.

11. The method of claim 9 wherein the mask job deck comprises a plurality of moving electron beam exposure system pattern generation files, wherein each moving electron beam exposure system pattern generation file includes a verification region in which patterns corresponding to verification elements are disposed.

12. The method of claim 9, wherein the verification elements comprise one of each type of transistor cell in the device region.

13. The method of claim 12, wherein the verification elements comprise one of each type of capacitor cell in the device region.

14. The method of claim 13, wherein the verification elements comprise one of each type of electrical fuse cell in the device region and one of each type of resistor cell in the device region.

15. The method of claim 12, wherein the verification elements comprise a no-fill region.

16. The method of claim 7, wherein the verifying a mask job deck further comprises, for each revision after the manufacture of the first set of masks, checking the revision regions for that revision and revision regions for any previous revisions, to verify that all revision regions for mask layers that have been changed include a pattern.

\* \* \* \* \*